United States Patent
Han et al.

(10) Patent No.: US 7,648,910 B2
(45) Date of Patent: Jan. 19, 2010

(54) METHOD OF MANUFACTURING OPENING AND VIA OPENING

(75) Inventors: Ching-Jen Han, Taichung (TW); Wen-Shun Lo, Hsinchu County (TW); Yung-Han Chiu, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 138 days.

(21) Appl. No.: 11/748,801

(22) Filed: May 15, 2007

(65) Prior Publication Data

US 2008/0160756 A1 Jul. 3, 2008

(30) Foreign Application Priority Data

Dec. 29, 2006 (TW) ............................... 95149977 A

(51) Int. Cl.
*H01L 21/4763* (2006.01)
*H01L 21/311* (2006.01)
(52) U.S. Cl. ........................ 438/640; 438/696; 438/701; 257/E21.578
(58) Field of Classification Search ...................... 438/9, 438/637–640, 668, 701–757; 257/774
See application file for complete search history.

(56) References Cited

U.S. PATENT DOCUMENTS

| | | | | |
|---|---|---|---|---|
| 5,719,089 | A * | 2/1998 | Cherng et al. ............... | 438/637 |
| 5,948,701 | A * | 9/1999 | Chooi et al. ................. | 438/694 |
| 6,007,672 | A * | 12/1999 | Saito et al. ............. | 156/345.47 |
| 6,020,258 | A | 2/2000 | Yew et al. | |
| 6,258,713 | B1 * | 7/2001 | Yu et al. ...................... | 438/634 |
| 6,284,657 | B1 * | 9/2001 | Chooi et al. ................. | 438/687 |
| 6,395,586 | B1 * | 5/2002 | Huang et al. ................. | 438/149 |
| 6,399,483 | B1 | 6/2002 | Liu et al. | |
| 6,475,836 | B1 * | 11/2002 | Suzawa et al. .............. | 438/149 |
| 7,303,648 | B2 * | 12/2007 | Park et al. .............. | 156/345.24 |
| 2002/0117472 | A1 * | 8/2002 | Sun et al. ....................... | 216/68 |
| 2003/0159779 | A1 * | 8/2003 | Sago et al. ............. | 156/345.24 |
| 2006/0050192 | A1 * | 3/2006 | Cho et al. ...................... | 349/42 |

* cited by examiner

*Primary Examiner*—Savitri Mulpuri
*Assistant Examiner*—Calvin Choi
(74) *Attorney, Agent, or Firm*—J.C. Patents

(57) ABSTRACT

A method of manufacturing an opening is described. First, a substrate including a conductive portion and a dielectric layer both formed thereon is provided. The conductive portion at least includes a conductive layer and a passivation layer from bottom-up, and the dielectric layer covers the conductive portion. A first dry etching step is then performed to form an opening on the passivation layer by using a reactive gas containing a high polymer gas. The bottom of the opening has an initial dimension, and an obtuse angle is included by the bottom of the opening and an inner sidewall of the opening. Next, an opening enlarging step is performed to reach a target dimension of the bottom of the opening. The target dimension is larger than the initial dimension and to the least extent the conductive layer is not exposed by the opening.

16 Claims, 3 Drawing Sheets

METHOD OF MANUFACTURING OPENING AND VIA OPENING

CROSS-REFERENCE TO RELATED APPLICATION

This application claims the priority benefit of Taiwan application serial no. 95149977, filed Dec. 29, 2006. All disclosure of the Taiwan application is incorporated herein by reference.

BACKGROUND OF THE INVENTION

1. Field of the Invention

The present invention relates to a method of manufacturing a semiconductor structure, and more particularly to a method of manufacturing an opening and a via opening.

2. Description of Related Art

With the rapid progress in integrated circuit (IC) technologies, device miniaturization and device integration are definitely on the rise and have become an important subject in various industries. Due to increasing integrity of ICs, the surface of a chip can hardly provide sufficient area for fabricating required interconnects. In order to comply with the high demand for the interconnects as the size of the semiconductor device is decreased, it is necessary to adopt two- or multi-level interconnects in current IC devices.

In most cases, dielectric layers are used to separate conductive layers (e.g. electrodes and conductive lines, or the conductive lines in different layers from one another). Thereby, the occurrence of short circuit resulting from direct contacts between each of the conductive layers can be avoided. Moreover, contact plugs or via plugs are formed in the dielectric layers to connect the upper conductive layer and the lower conductive layer.

However, with the decrease in line widths within the semiconductor devices and the increase in integrity, overlay errors among film layers or the limitation of the optical design rule to a lithography and etching process may frequently occur, which leads to misalignment or an un-landed phenomenon when the dielectric layers are defined to form the opening.

Please refer to FIG. 1 which is a cross-sectional view depicting a structure of a conventional via opening. An aluminum conductive line 110 and a titanium nitride layer 120 are disposed on a substrate 100, and a dielectric layer 130 covers the titanium nitride layer 120 and the substrate 100. On account of the un-landed phenomenon, a via opening 145 is not fully formed on the titanium nitride layer 120 during the process of etching the via opening 145. Instead, a divot 155 is formed at a sidewall of the aluminum conductive line 110 by etching through the dielectric layer 130 and the titanium nitride layer 120, such that the aluminum conductive line 110 below the titanium nitride layer 120 is exposed. Thus, impurities and residues e.g. fluorine aluminum ($AlF_3$) generated by the etching process cannot be completely removed in a following cleaning process. Thereby, the film layer subsequently deposited in the via opening 145 is further affected, which leads to variations in contact resistance of the via plugs and to reduction of the electrical quality of the device. The influence caused by said residues is particularly significant in a deep sub-micron fabrication process.

SUMMARY OF THE INVENTION

In view of the foregoing, the present invention provides a method of manufacturing an opening. The method is capable of controlling a width and a depth of the opening and of preventing difficult-to-remove residues from forming after etching.

The present invention further provides a method of manufacturing a via opening, so as to avoid problems caused by an un-landed phenomenon and to enhance the electrical performance of the device.

The present invention provides a method of manufacturing an opening. First, a substrate including a conductive portion and a dielectric layer both formed thereon is provided. The conductive portion at least includes a conductive layer and a passivation layer from bottom-up, and the dielectric layer covers the conductive portion. A first dry etching step is then performed to form an opening on the passivation layer by using a reactive gas containing a high polymer gas. A bottom of the opening has an initial dimension, and an obtuse angle is included by the bottom of the opening and an inner sidewall of the opening. Next, an opening enlarging step is performed to reach a target dimension of the bottom of the opening is achieved. The target dimension is larger than the initial dimension and to the least extent the conductive layer is not exposed by the opening.

According to one embodiment of the present invention, the obtuse angle is greater than 93 degrees.

According to one embodiment of the present invention, a difference between the target dimension and the initial dimension is less than a thickness of the passivation layer.

According to one embodiment of the present invention, the material of the conductive layer includes aluminum.

According to one embodiment of the present invention, polymers attached to an inner wall of a top of the opening are in a greater amount than the polymers attached to the inner wall of the bottom of the opening during the first dry etching step.

According to one embodiment of the present invention, the opening enlarging step includes performing a second dry etching step.

According to said method of manufacturing the opening, the opening is firstly formed by performing the first dry etching step with use of the high polymer gas and further enlarged to the target dimension through performing the second dry etching step. Said method is capable of controlling the etching depth of the dielectric layer and of preventing the conductive layer from exposing. Moreover, the residues are not generated, such that the device with better electrical quality is fabricated.

In order to make the above and other objects, features and advantages of the present invention more comprehensible, several embodiments accompanied with figures are described in detail below.

DESCRIPTION OF EMBODIMENTS

Figure 1:
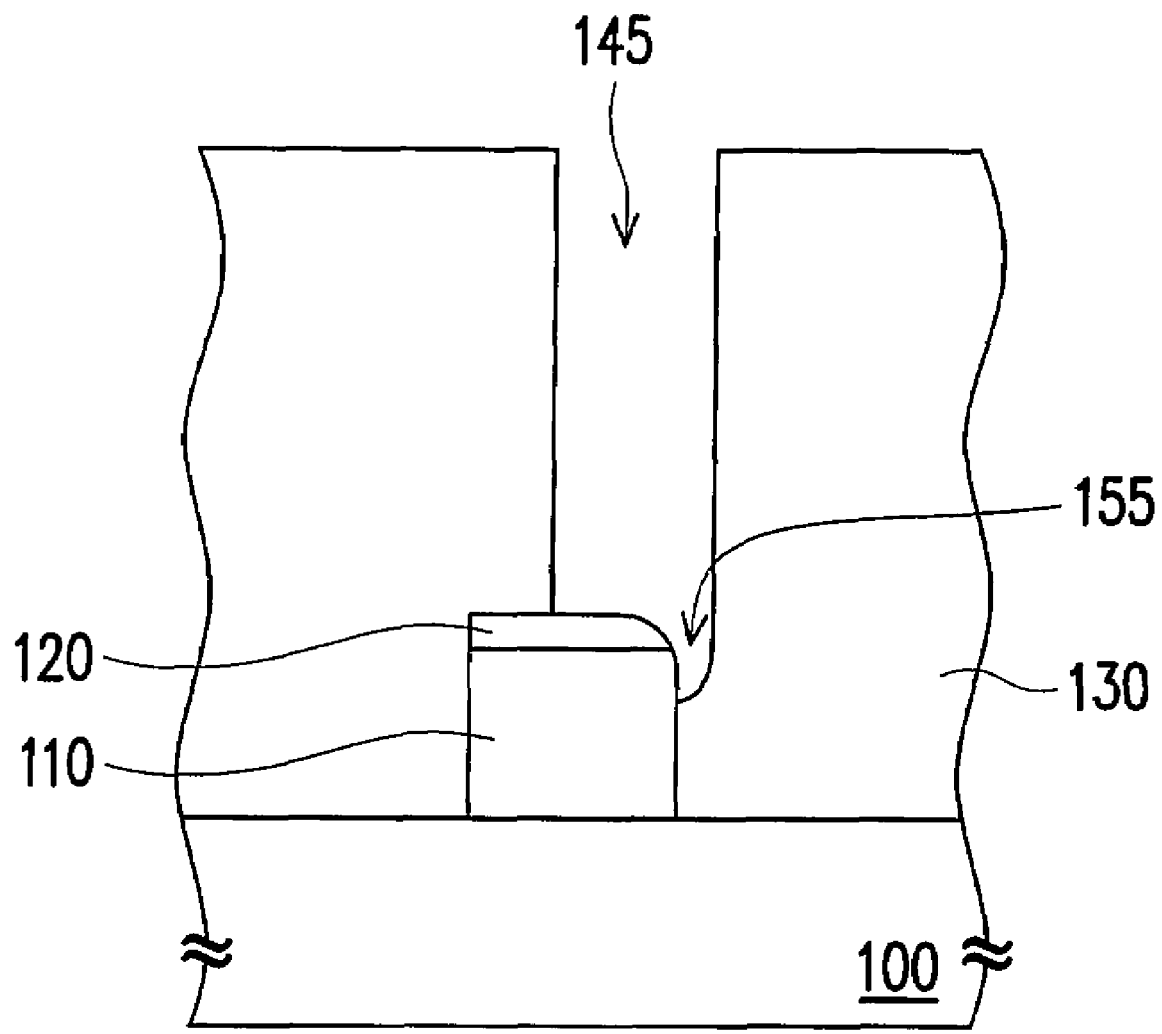
FIG. 1 is a cross-sectional view depicting a structure of a conventional via opening.
Figure 2A:
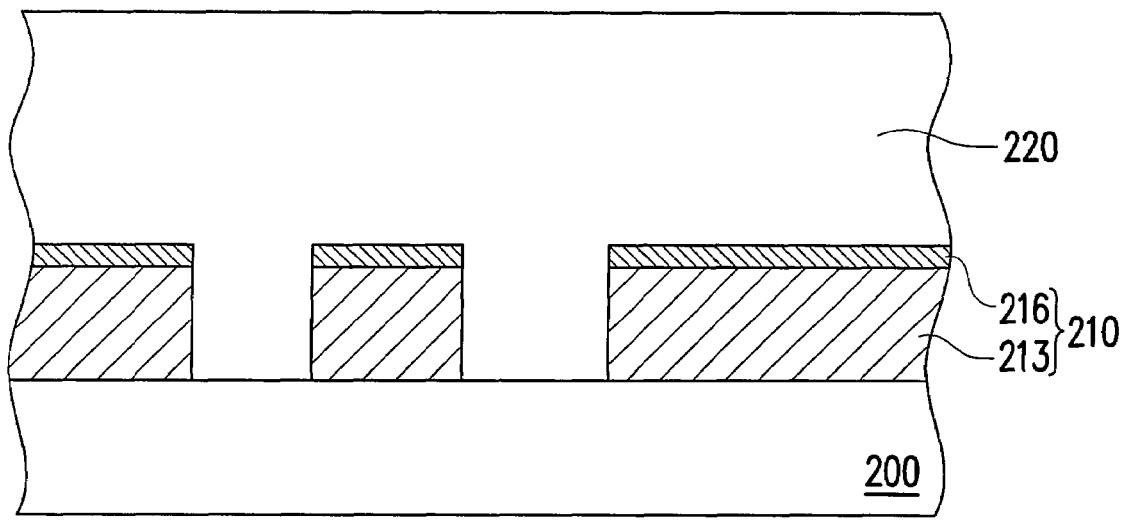
FIGS. 2A through 2C are cross-sectional views depicting the steps of manufacturing an opening according to an embodiment of the present invention.
Figure 2B:
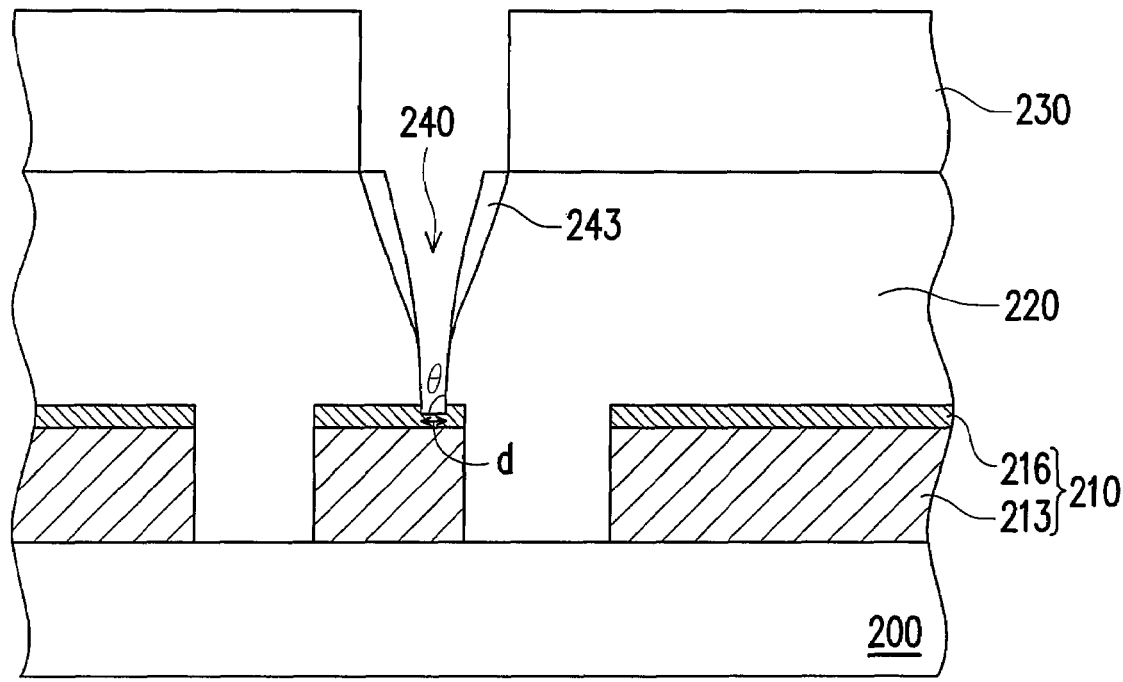
Figure 2C:
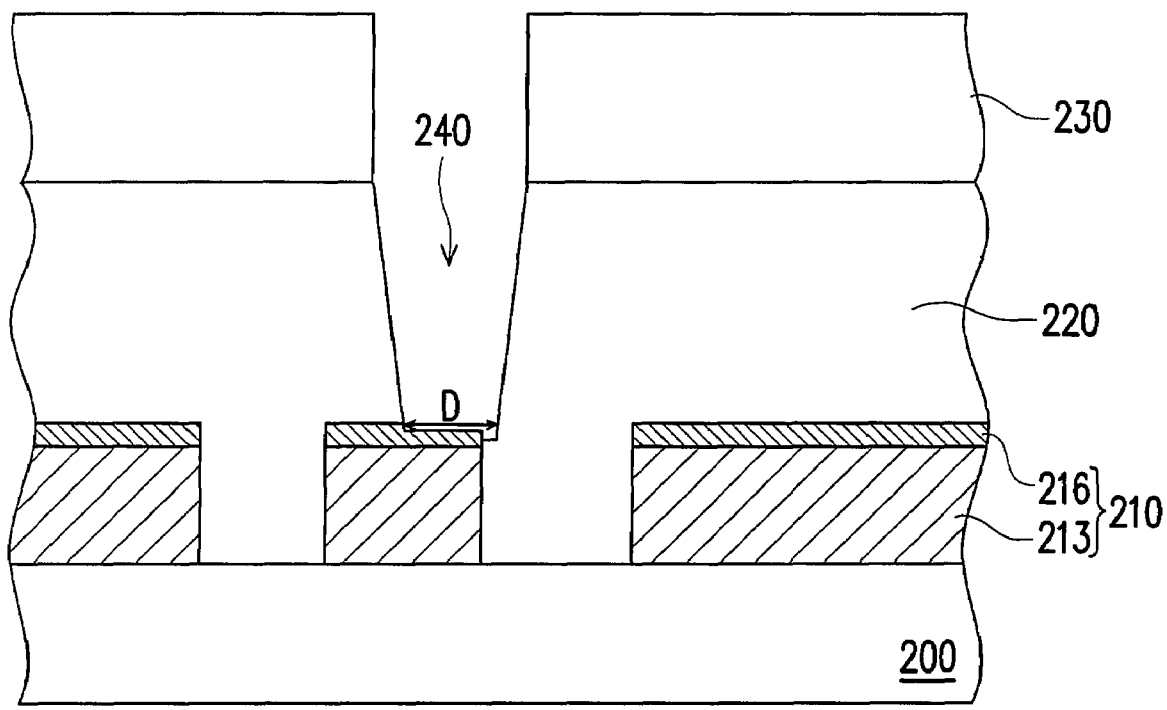

FIGS. 2A through 2C are cross-sectional views depicting the steps of manufacturing an opening according to an embodiment of the present invention.

Referring to FIG. 2A, the present embodiment is demonstrated by taking the method of manufacturing a via opening for an example. According to the method, a substrate 200 including a conductive line 210 and a dielectric layer 220 both formed thereon is provided first. The substrate 200 is, for example but not limited to, a silicon substrate. The conductive line 210 at least includes a conductive layer 213 and a passivation layer from bottom-up. The passivation layer in the present embodiment is, for example, a barrier layer 216. The material of the conductive layer 213 is, for example but not limited to, metal such as aluminum, copper, or an aluminum-containing alloy. Aluminum or the aluminum-containing alloy is preferred. The material of the barrier layer 216 is, for example but not limited to, titanium, titanium nitride, chromium, a titanium tungsten alloy, tantalum, or tantalum nitride, preferably titanium/titanium nitride. The dielectric layer 220 covers the conductive line 210. A thickness of the barrier layer 216, for example, ranges from 400 Å to 700 Å. The material of the dielectric layer 220 is, for example but not limited to, insulating material such as silicon oxide and the like. The method of forming the dielectric layer 220 includes first performing a high density plasma chemical vapor deposition (HDP-CVD) process to fill spaces among the conductive line 210. Thereafter, a chemical vapor deposition (CVD) process is performed with use of tetra-ethyl-ortho-silicate (TEOS) as a reactive gas. Then, planarization is carried out to form the dielectric layer 220.

Next, as shown in FIG. 2B, a patterned photoresist layer 230 is formed on the dielectric layer 220. The method of forming the patterned photoresist layer 230 includes forming a layer of positive photoresist on the dielectric layer 220 by performing a spin-coating process, and implementing a photo-exposure and development process thereafter.

The patterned photoresist layer 230 is then used as a mask to perform a first dry etching step on the dielectric layer 220 with use of the reactive gas containing a high polymer gas. The first dry etching step includes performing a reactive ion etching process. For example, a via opening 240 having an initial dimension d is formed on the barrier layer 216. The high polymer gas refers to the gas which leads to the formation of more polymers 243 attached to the etched sidewall during the etching process, such as octafluorocyclobutane ($C_4F_8$) and carbon oxide (CO). The deposition of the polymers may bring about an undercut carried out on the profile of an inner wall of the via opening 240. A bottom of the via opening 240 and the inner wall thereof include an obtuse angle θ exceeding 93 degrees, for example. Since the bottom of the via opening 240 has a smaller initial dimension d, the via opening 240 can be precisely formed on the barrier layer 216 without exceeding the extent thereof, which results in non-occurrence of an un-landed phenomenon. The reactive gas employed in the first dry etching step can further include other etching gases e.g. trifluoromethane ($CHF_3$), noble gases e.g. argon (Ar) or nitrogen ($N_2$), and cleaning gases e.g. oxygen ($O_2$).

According to one embodiment, the reactive gas adopted in the first dry etching step includes the high polymer gases $C_4F_8$ and CO. The cleaning gas e.g. $O_2$, the noble gas Ar, and $CHF_3$ can be further incorporated. Here, a flow of $C_4F_8$ is, for example but not limited to, in a range of 12~20 sccm, while the flow of CO is in the range of 90~400 sccm, preferably in the range of 100~330 sccm. The flow of $O_2$ is in the range of 0~3 sccm, the flow of Ar is in the range of 300~400 sccm, and the flow of $CHF_3$ is in the range of 30~50 sccm, for example. Besides, a pressure in a reaction chamber ranges from 20 mT to 60 mT, for example, and the power consumed approximately ranges from 600 W~1800 W.

Next, referring to FIG. 2C, a second dry etching step i.e. an opening enlarging step is performed. The reactive gas used in the second dry etching step is, for example but not limited to, carbon tetrafluoride ($CF_4$). In addition, the pressure in the reaction chamber is, for example, increased to 60 mT~200 mT, preferably to 80 mT~120 mT. Medium- and low-radio frequency power in the range of 300~800 W is adopted, for example. In the first dry etching step, the polymers 243 attached to the top and the middle of the via opening 240 are in a greater amount than those attached to the bottom of the via opening 240. Thus, a critical dimension (CD) of the bottom of the via opening 240 is enlarged to a target dimension D after the second dry etching step is performed.

According to one embodiment, an etching rate of the dielectric layer made of silicon oxide ranges from 0.7 nm/sec to 1.2 nm/sec, and the etching rate of the barrier layer 216 made of titanium/titanium nitride ranges from 0.84 nm/sec to 1.34 nm/sec. An etching selectivity ratio of the barrier layer 216 to the dielectric layer 220 approximately ranges from 0.92 to 1.2. Thus, in the second dry etching step, the lateral etching length obtained through the opening enlarging step (i.e. the difference between the target dimension D and the initial dimension d) and the vertical etching depth are similar. The length of the etching time is determined according to the target dimension D of the via opening 240. The extent of the via opening 240 may slightly exceed the extent of the barrier layer 216 because of the enlargement of the via opening 240, which results in a downward etching on a sidewall of the conductive line 210. However, since the difference between the target dimension D and the initial dimension d is less than the thickness of the barrier layer 216, the depth of the via opening 240 resulting from the un-landed phenomenon does not exceed the thickness of the barrier layer 216, such that an exposure of the conductive layer 213 can be avoided.

According to said method, not only can the target dimension D of the via opening 240 be reached, but also the formation of the hard-to-clean residues in the via opening 240 can be prevented, such that the subsequent cleaning process may be further omitted. Additionally, the quality of film layers deposited in the via opening 240 is improved, and the electrical performance of via plugs and the efficiency of the device are further enhanced.

The aforementioned embodiment is demonstrated by taking the method of manufacturing the via opening for an example. However, the method of manufacturing the opening provided by the present invention is not limited to the fabrication of the via opening and is applicable to forming a contact opening and trench.

To sum up, in the method of manufacturing the opening disclosed in the present invention, the opening with a smaller dimension is firstly formed with use of the high polymer gas as the reactive gas in the first dry etching step. The opening is ensured to be formed on a passivation layer. Next, the opening is enlarged by performing the second dry etching step, so as to reach the predetermined target dimension.

Through said method, the desirable target dimension is reached, the width and the depth of the opening are precisely controlled, the un-landed phenomenon is avoided, and the exposure of the lower conductive layer is prevented. Furthermore, the method is capable of prohibiting the formation of the difficult-to-remove residues after the etching steps are performed and of enhancing the electrical performance of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an opening, comprising:

providing a substrate including a conductive portion and a dielectric layer both formed thereon, wherein the conductive portion at least comprises a conductive layer and a passivation layer from bottom-up, and the dielectric layer covers the conductive portion;

performing a first dry etching step to the dielectric layer to form an opening on the passivation layer by using a reactive gas containing a high polymer gas, wherein an original thickness of the passivation layer below the opening is reduced to a reduced thickness, a bottom of the opening has an initial dimension, and an obtuse angle is included by the bottom of the opening and an inner sidewall of the opening; and performing an opening enlarging step to reach a target dimension of the bottom of the opening, wherein the target dimension is larger than the initial dimension to the least extent the conductive layer is not exposed by the opening, and a difference between the target dimension and the initial dimension is less than the reduced thickness of the passivation layer.

2. The method of claim 1, wherein the obtuse angle is greater than 93 degrees.

3. The method of claim 1, wherein the material of the conductive layer comprises aluminum.

4. The method of claim 1, wherein polymers attached to an inner wall of a top of the opening are in a greater amount than the polymers attached to the inner wall of the bottom of the opening during the first dry etching step.

5. The method of claim 1, wherein the opening enlarging step comprises performing a second dry etching step.

6. The method of claim 5, wherein an etching selectivity ratio of the passivation layer to the dielectric layer is approximately in a range of 0.92~1.2 in the second dry etching step.

7. The method of claim 5, wherein the pressure in a reaction chamber during the second dry etching step is higher than the pressure in the reaction chamber during the first dry etching step.

8. The method of claim 5, wherein the pressure in the reaction chamber during the second dry etching step ranges from 60 mT to 200 mT.

9. The method of claim 5, wherein the power consumed in the second dry etching step ranges from 300 W to 800 W.

10. The method of claim 1, wherein the material of the dielectric layer comprises silicon oxide.

11. The method of claim 1, wherein the material of the passivation layer comprises titanium/titanium nitride.

12. The method of claim 1, wherein the high polymer gas comprises carbon oxide (CO) and octafluorocyclobutane ($C_4F_8$).

13. The method of claim 12, wherein a flow of CO ranges from 90 sccm to 400 sccm while the flow of $C_4F_8$ ranges from 12 sccm to 20 sccm.

14. The method of claim 1, wherein the reactive gas further comprises a cleaning gas.

15. The method of claim 14, wherein the cleaning gas comprises oxygen, and the flow of oxygen is less than 3 sccm.

16. The method of claim 1, wherein the reactive gas further comprises oxygen, argon, and trifluoromethane ($CHF_3$).

* * * * *